(12) United States Patent
Hsu

(10) Patent No.: US 6,649,506 B2
(45) Date of Patent: Nov. 18, 2003

(54) METHOD OF FABRICATING VIAS IN SOLDER PADS OF A BALL GRID ARRAY (BGA) SUBSTRATE

(75) Inventor: Shih-Ping Hsu, TaoYuan (TW)

(73) Assignee: Phoenix Precision Technology Corporation (TW)

(*) Notice: Subject to any disclaimer, the term of this patent is extended or adjusted under 35 U.S.C. 154(b) by 0 days.

(21) Appl. No.: 09/939,480

(22) Filed: Aug. 24, 2001

(65) Prior Publication Data
US 2003/0022419 A1 Jan. 30, 2003

(51) Int. Cl.[7] .............................................. H01L 21/44
(52) U.S. Cl. ....................................... 438/612; 257/737
(58) Field of Search ................................. 438/121, 106, 438/108, 123, 611, 612; 428/209, 901; 257/735, 738

(56) References Cited

U.S. PATENT DOCUMENTS 6,010,768 A * 1/2000 Yasue et al. ................ 428/209

6,376,052 B1 * 4/2002 Asai et al. .................. 428/209

* cited by examiner

Primary Examiner—Matthew Smith
Assistant Examiner—Calvin Lee

(57) ABSTRACT

Disclosed is a method for fabricating vias in solder pads of a ball grid array (BGA) substrate. The substrate is drilled to form the plural vias, and then the interior surfaces of said vias are plated with a copper layer for forming the electrically conductive vias. After the high solid content of the resin is adopted for being plugged into the electrically conductive vias, the both ends of the electrically conductive vias and the upper surface and the lower surface of the substrate are plated with a copper layer. Then said copper layers are etched to form the upper circuit layer and the lower circuit layer and the solder pads. The method in present invention can increase the density of the circuits. Because the both ends of the electrically conductive vias plugged with the resin are very planar, it can be made use of forming a core layer for the built-up fabrication.

7 Claims, 5 Drawing Sheets

METHOD OF FABRICATING VIAS IN SOLDER PADS OF A BALL GRID ARRAY (BGA) SUBSTRATE

BACKGROUND OF THE INVENTION

1. Field of the Invention

The present invention relates to a method of fabricating vias in solder pads of a ball grid array (BGA) substrate, and to a method of fabricating electrically conductive vias between the upper circuit layer and the lower circuit layer.

2. Description of the Prior Art

A BGA substrate has been utilized for IC packages for a period of time. Referring to FIG. 1, a BGA package comprises a chip 10, a substrate 20, an encapsulation 30, and a plurality of solder balls 40.

The substrate 20 is a laminated material that was made of an insulating resin. The upper circuit layer 21 and the lower circuit layer 22 formed on the both surfaces of the substrate 20 can be conducted by a plurality of the electrically conductive vias 50. The chip 10 is combined with the upper surface of the substrate 20 and the circuit layout of the chip 10 is coupled to the upper circuit layer 21 by the golden wires 11. The surface of the upper circuit layer 21 is covered with a layer of epoxy 23 as a protective layer. On the other hand, in order to prevent the chip 10 and the golden wires 11 from outside effect, the sealed site between the chip 10 and the substrate 20 should be protected by encapsulation 30.

There is a plurality of solder pads 24 on the surface of the lower circuit layer 22. The surface of the lower circuit layer 22 is covered with the solder mask 25, which has a plurality of round holes corresponding to the solder pads 24. The substrate 20 can electrically contact the printed circuit board (not shown) by a plurality of solder balls 40 soldered with the solder pads 24.

As described above, the electrically conductive vias 50 serve as the conductors between the upper circuit layer 21 and the lower circuit layer 22.

The FIGS.2A to 2C illustrate the steps in the process for forming the electrically conductive vias in accordance with the prior art. The steps can be summarized as follows.

(a) Provide an insulating substrate 20 and form a plurality of vias 501 through the substrate 20 by drilling.

(b) Plate the interior surfaces of the vias 501 and the upper surface and the lower surface of the substrate 20 with a thin copper layer 21a, 22a, and then the electrically conductive vias 50 are formed.

(c) Etch the upper thin copper layer 21a and the lower thin copper layer 22a to form the upper circuit layer 21 and the lower circuit layer 22.

(d) Plug the epoxy or the conductive resin 502 into the electrically conductive vias 50.

The above-mentioned prior art has the following defects.

1. The copper layer on the interior surfaces of the electrically conductive vias 50 will be readily microetched or become thinner. Since the plugging step is not performed before the etching step, the copper layer on the interior surfaces of the electrically conductive vias 50 will lack of the protection afforded by the resin. Therefore, it will be readily damaged or become thinner after the etching step, which results in poor reliability.

2. The step (d) of the prior art is to plug the material 502 made of the epoxy or the electrically conductive resin into the electrically conductive vias 50. The material 502 is not a high solid resin and the plugging step is implemented while the upper surface of the substrate 20 is coated with the epoxy as a protective layer, so the upper surface and the lower surface of the electrically conductive vias 50 plugged with resin are easily sunken, which causes poor reliability.

3. The space used by the electrically conductive vias 50 limits the number of the circuits that can be formed in a given area of a substrate.

SUMMARY OF THE INVENTION

An object of this invention is to provide a method of fabricating vias in solder pads of a BGA substrate. Some high solid content resin is adopted to be plugged into the electrically conductive vias for making the upper surface and lower surface of the both ends of the electrically conductive vias more planar. The sunken problem could be overcome.

Another object of this invention is to provide a method of fabricating vias in solder pads of a BGA substrate. After the both ends of the electrically conductive vias plugged with the resin are roughened by blasting, the both ends of the electrically conductive vias and the upper surface and the lower surface of the substrate are plated with a copper layer. Because the adoption of the roughened method brings the better ability of the adhesion between the resin and the copper layer, the higher reliability could be obtained. The method of fabricating vias in solder pads of a BGA substrate comprises the following steps:

(a) Provide an insulating substrate and form a plurality of vias through the substrate by drilling.

(b) Plate the interior surface of said vias with a thin copper layer by direct plating for forming the electrically conductive vias.

(c) Plug the high solid content of the resin into the electrically conductive vias and remove the redundant resin by scrubbing.

(d) Roughen the surface of said resin by scrubbing and blasting.

(e) Plate the both ends of the electrically conductive vias and the upper and lower surfaces of the substrate with a thin copper layer.

(f) Etch the thin copper layers on the upper surface and the lower surface of the substrate to form the circuit layers, and form the solder pads on the vias.

The above steps are the method of fabricating vias in solder pads of a BGA substrate of this invention. The density of the circuits (dependent upon the diameter of the vias) is about 15~30% more than the prior art. In addition, since the moisture doesn't ventilate from each other, the thin copper layer on the interior surfaces of the electrically conductive vias could be protected and prevented from being damaged by microetching, which results in higher reliability for the BGA substrate.

BRIEF DESCRIPTION OF THE DRAWINGS

The objects, features and advantages of the present invention will be apparent from the following, and more particularly detailed description of the invention will be illustrated in the accompanying drawings, in which.

DETAILED DESCRIPTION OF THE PREFERRED EMBODIMENTS

Figure 1:
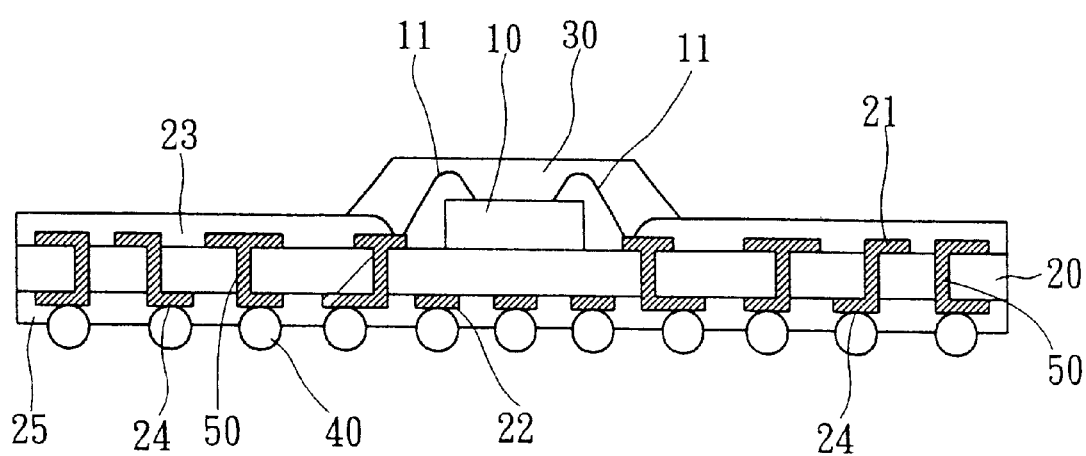
FIG. 1 is a cross-section diagram of a typical BGA substrate structure.
Figure 2A:
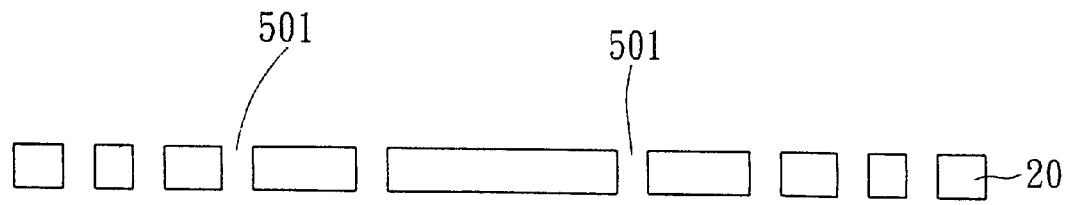
FIGS. 2A to 2C are cross-section diagrams of fabricating the electrically conductive vias and the pads on a BGA substrate of the prior art.
Figure 2B:
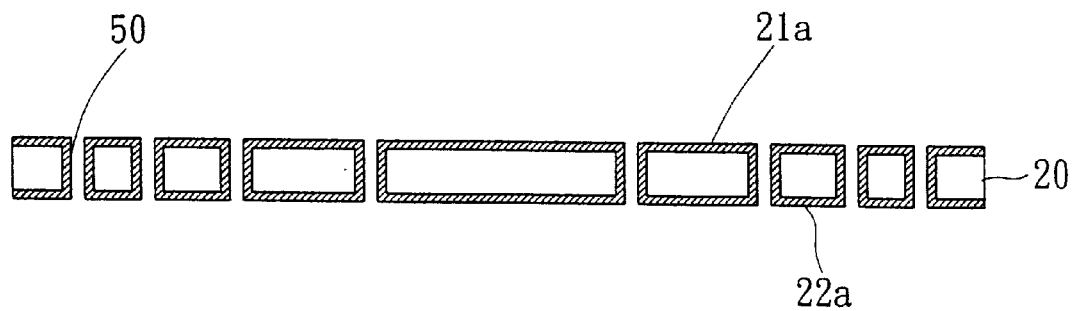
Figure 2C:
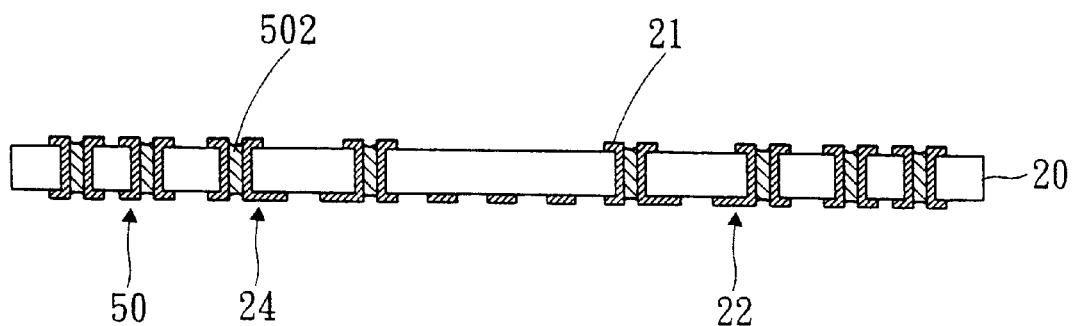
Figure 3A:
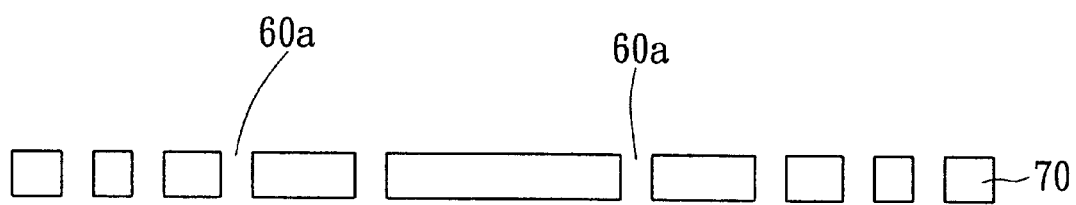
FIGS. 3A to 3E are cross-section diagrams of fabricating vias in solder pads of a BGA substrate according to the embodiment of this invention.
Figure 3B:
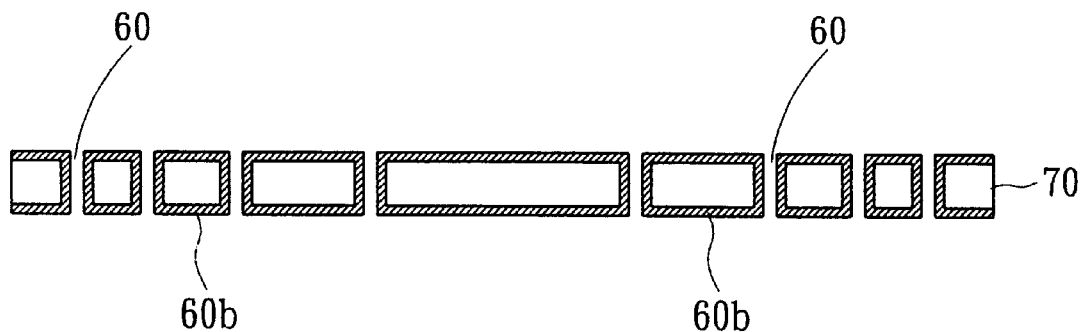
Figure 3C:
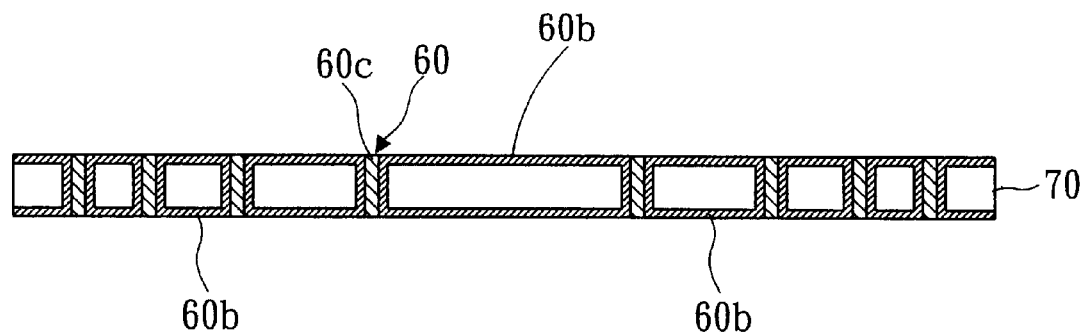
Figure 3D:
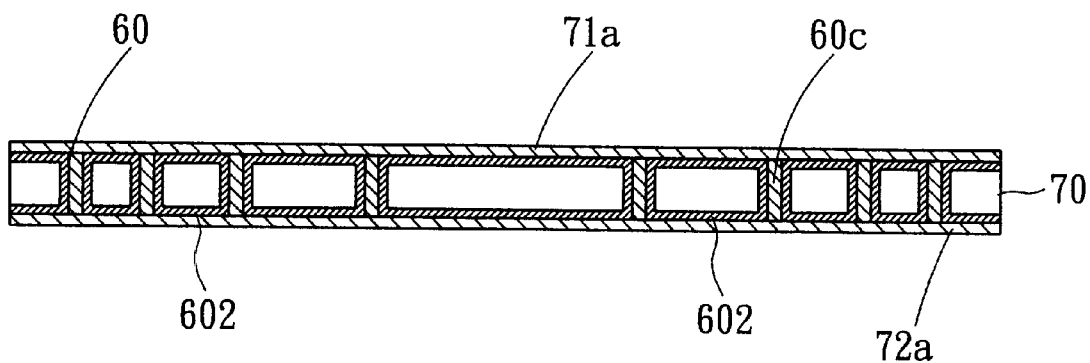
Figure 3E:
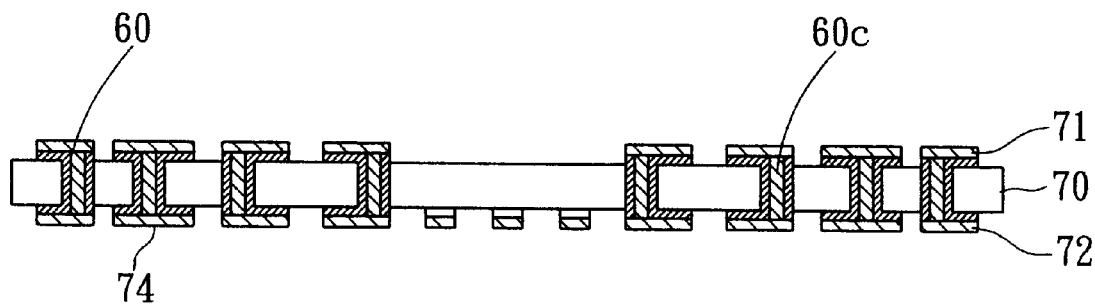

FIGS. 3A to 3E are the cross-section diagrams of fabricating vias in solder pads of BGA substrate of this invention. The process of fabricating vias in solder pads of this invention includes the following steps:

(a) Provide one insulating substrate 70 and form a plurality of vias 60a through the substrate by drilling.

(b) Plate the interior surface of the vias 60a and the upper surface and the lower surface of the substrate 70 with a thin copper layer 60b, and the electrically conductive vias 60 are formed.

(c) Plug the high solid content resin 60c into the electrically conductive vias 60.

d) Roughen the upper surface and the lower surface of the resin 60c of electrically conductive vias 60 by scrubbing and blasting.

(e) Direct plate the upper surface and the lower surface of the resin 60c with a thin electrically conductive film.

(f) Plate the upper surface and the lower surface of the resin 60c and the upper surface and the lower surface of the substrate 70 with a thin copper layer 71a, 72a.

(g) Etch the thin copper layers 71a, 72a to form the upper circuit layer 71, the lower circuit layer 72, and the solder pads 74 on the electrically conductive vias 60 in the lower side of the substrate 70.

What mentioned above in this invention is described in detail for the process of fabricating vias in solder pads of a BGA substrate. In comparison with the prior art, it has the following advantages:

1. The upper circuit layer 71 and the lower circuit layer 72 of the substrate 70 can be electrically conducted by the copper layers 60b plated on the interior surfaces of the vias 60a. The both ends of the electrically conductive vias 60 and the upper surface and the lower surface of the substrate are also plated with a copper layer 60b, and then said copper layers are etched to form the upper circuit layer 71 and the lower circuit layers 72 and the solder pads 74 located on the electrically conductive vias 60. Compared with the prior art, the higher circuits density and the areas can be obtained.

2. The high solid content resin 60c is made use of being plugged into the electrically conductive vias 60, and the plugging step is achieved before the implement of the plating and etching steps, which can overcome the problem of the sunken resin and microetched the electrically conductive vias in the prior art. Therefore, the both ends of the electrically conductive vias plugged with the resin can be plated with planar copper layers, and it can be made use of forming a core layer for the built-up fabrication.

3. In this invention, the surface of the resin 60c can be roughened by scrubbing and blasting to enhance the adhesion before the upper surface and the lower surface of the substrate are plated with the thin copper layer 71a, 72a. The improvement of adhesion brings the better reliability for the resin of vias and the thin copper layers of the BGA substrate.

Figure 4:
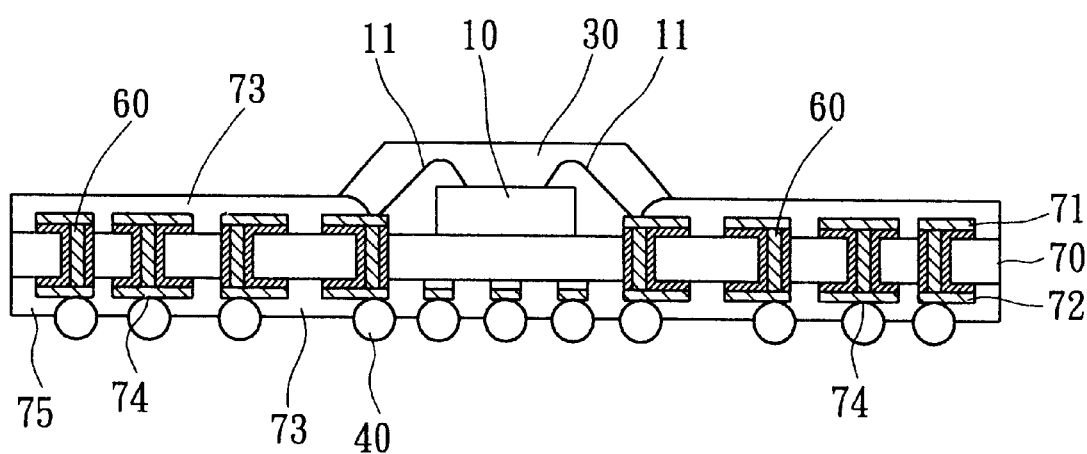
FIG. 4 is a cross-section diagram of a BGA substrate structure of this invention.

FIG. 4 shows the cross-section diagram of structures for the vias in the solder pads of a BGA substrate. The method of the present invention is to combine a chip 10 with the upper surface of the substrate 70 and couple the circuit of the chip 10 with the upper circuit layer 71 by the golden wires 11. The circuit layer 71 is covered with a protective layer 73. The sealed site between the chip 10 and the substrate 70 can be protected with encapsulation 30 to prevent a chip 10 with the golden wires 11 from external effect. The plural openings formed on the protective layers 73 correspond to the solder pads 74 on the electrically conductive vias 60 of the lower side of the substrate 70. The solder balls 40 soldered with the solder pads 74 are combinations of the circuits of the BGA substrate and a printed circuit board (not shown). The preferred embodiments of the invention have been described as above. The description are intended to be illustrate, and not limitative. It will be understood by those skilled in the art that various changes in form and detail may be made therein without departing from the true spirit and scope of the invention as defined by the appended claims. Therefore, the following claims define the scope of the protection afforded by the patent.

What is claimed is:

1. A method of fabricating vias in solder pads of a BGA substrate, comprising:

(a) providing a substrate and forming a plurality of vias through said substrate;

(b) plating the interior surfaces of said vias with a first thin copper layer for forming electrically conductive vias;

(c) plugging resin into said electrically conductive vias, each resin having an upper surface and a lower surface;

(d) roughening only the upper and lower surfaces of the resins;

(e) plating said substrate and the roughened upper and lower surfaces of the resins with second thin copper layers; and (f) etching said second thin copper layers to form an upper circuit layer and a lower circuit layer, and to form solder pads on said electrically conductive vias.

2. The method of claim 1, said substrate is an insulating material.

3. The method of claim 1, wherein step (a) uses drilling.

4. The method of claim 1, wherein said resins are high solid content resins.

5. The method of claim 1, wherein the surfaces of the resins are planarized by scrubbing, and the material of said resins is an insulating material.

6. The method of claim 1, wherein the surfaces of the resins are roughened by scrubbing and blasting.

7. The method of claim 1, wherein the upper and lower surfaces of the two ends of the electrically conductive vias that are plugged with resin are plated with a thin electrically conductive film by direct plating before performing step (e).

* * * * *